(12) United States Patent
Kim et al.

(10) Patent No.: US 10,720,862 B2
(45) Date of Patent: Jul. 21, 2020

(54) METHOD OF CALCULATING MOTOR POSITION USING HALL SENSOR

(71) Applicants: Hyundai Motor Company, Seoul (KR); Kia Motors Corporation, Seoul (KR)

(72) Inventors: Sung Do Kim, Seoul (KR); Chang Seok You, Anyang-si (KR); Min Su Kang, Paju-si (KR); Joon Yong Lee, Seoul (KR); Dong Hun Lee, Anyang-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 203 days.

(21) Appl. No.: 16/028,113

(22) Filed: Jul. 5, 2018

(65) Prior Publication Data

US 2019/0165703 A1 May 30, 2019

(30) Foreign Application Priority Data

Nov. 28, 2017 (KR) .......................... 10-2017-0160378

(51) Int. Cl.
*H02P 6/17* (2016.01)
*H02P 27/08* (2006.01)
*G01D 5/244* (2006.01)
*G01R 33/00* (2006.01)
(Continued)

(52) U.S. Cl.
CPC ............... *H02P 6/17* (2016.02); *G01D 3/032* (2013.01); *G01D 5/145* (2013.01); *G01D 5/2448* (2013.01);
(Continued)

(58) Field of Classification Search
CPC .... H02P 6/17; H02P 21/12; H02P 6/15; H02P 6/08; H02P 27/08; G01D 3/032;
(Continued)

(56) References Cited

U.S. PATENT DOCUMENTS 8,278,853 B2 * 10/2012 Kitagawa .................. H02P 6/15
318/400.13
9,531,310 B2 * 12/2016 Lee ........................ H02P 27/08
(Continued)

FOREIGN PATENT DOCUMENTS

JP 2008115752 A 5/2008
JP 2012042411 A 3/2012
(Continued)

*Primary Examiner* — Freddie Kirkland, III
(74) *Attorney, Agent, or Firm* — Slater Matsil, LLP

(57) ABSTRACT

A method of calculating a motor position uses a hall sensor. The method can include determining a motor position in response to a signal change of a hall sensor installed to a motor, calculating a basic compensation value for compensating a motor position error due to signal measurement delay of the hall sensor, determining whether a current command condition for a constant-speed operation of the motor is satisfied, calculating a first-up compensation value and a first-down compensation value, calculating an average values of the deviation between d-q axes current commands, and correcting the motor position using the basic compensation value when a difference between the average values is less than a reference average value.

20 Claims, 6 Drawing Sheets

(51) Int. Cl.
  *G01R 33/07*    (2006.01)
  *H02P 6/08*     (2016.01)
  *G01D 5/14*     (2006.01)
  *H02P 6/15*     (2016.01)
  *H02P 21/12*    (2016.01)
  *G01D 3/032*    (2006.01)

(52) U.S. Cl.
  CPC ......... *G01R 33/0017* (2013.01); *G01R 33/07* (2013.01); *H02P 6/08* (2013.01); *H02P 6/15* (2016.02); *H02P 21/12* (2013.01); *H02P 27/08* (2013.01)

(58) Field of Classification Search
  CPC ...... G01D 5/145; G01D 5/2448; G01R 33/07; G01R 33/0017; G01R 33/072
  See application file for complete search history.

(56) References Cited

U.S. PATENT DOCUMENTS

| | | | |
|---|---|---|---|
| 9,927,495 B2 * | 3/2018 | Kim | G01R 33/0017 |
| 10,554,158 B2 * | 2/2020 | Lee | H02P 6/16 |
| 2016/0094165 A1 | 3/2016 | Lee et al. | |
| 2016/0109531 A1 | 4/2016 | Kim et al. | |

FOREIGN PATENT DOCUMENTS

| | | | |
|---|---|---|---|
| KR | 20150055354 A | 5/2015 | |
| KR | 20160045250 A | 4/2016 | |
| KR | 101655537 B1 | 9/2016 | |

\* cited by examiner

[FIG. 1]
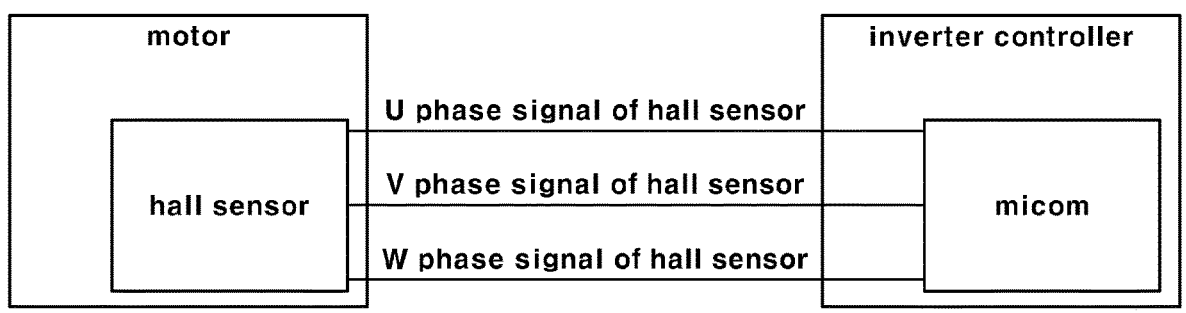

[FIG. 2]
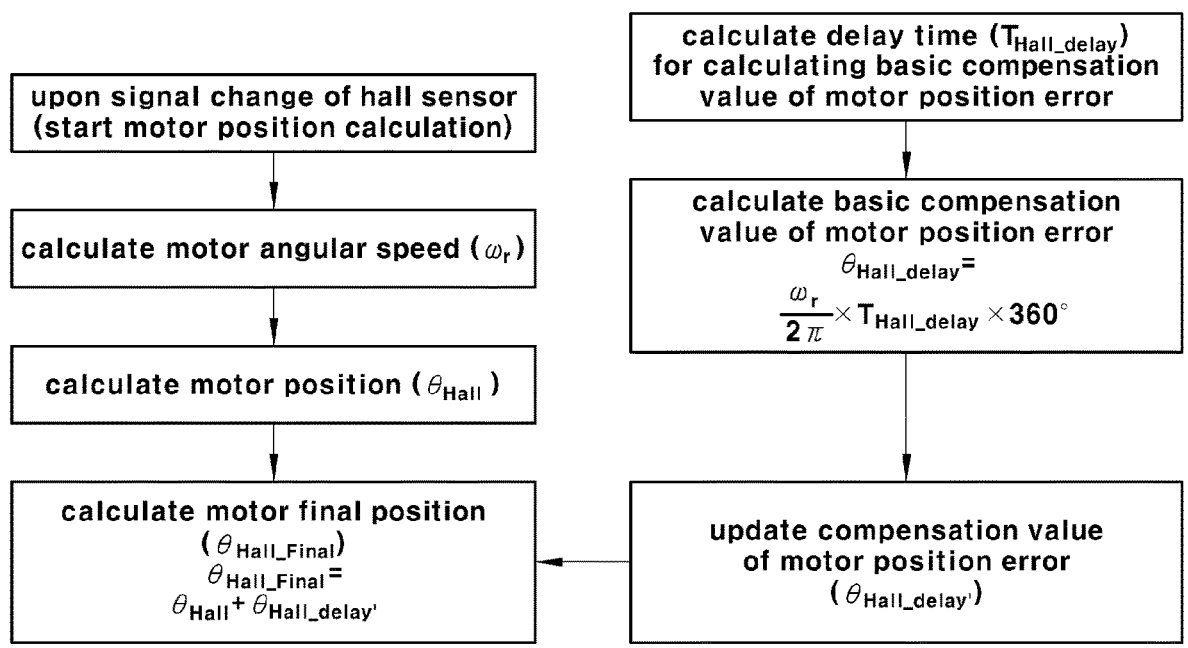

[FIG. 3]
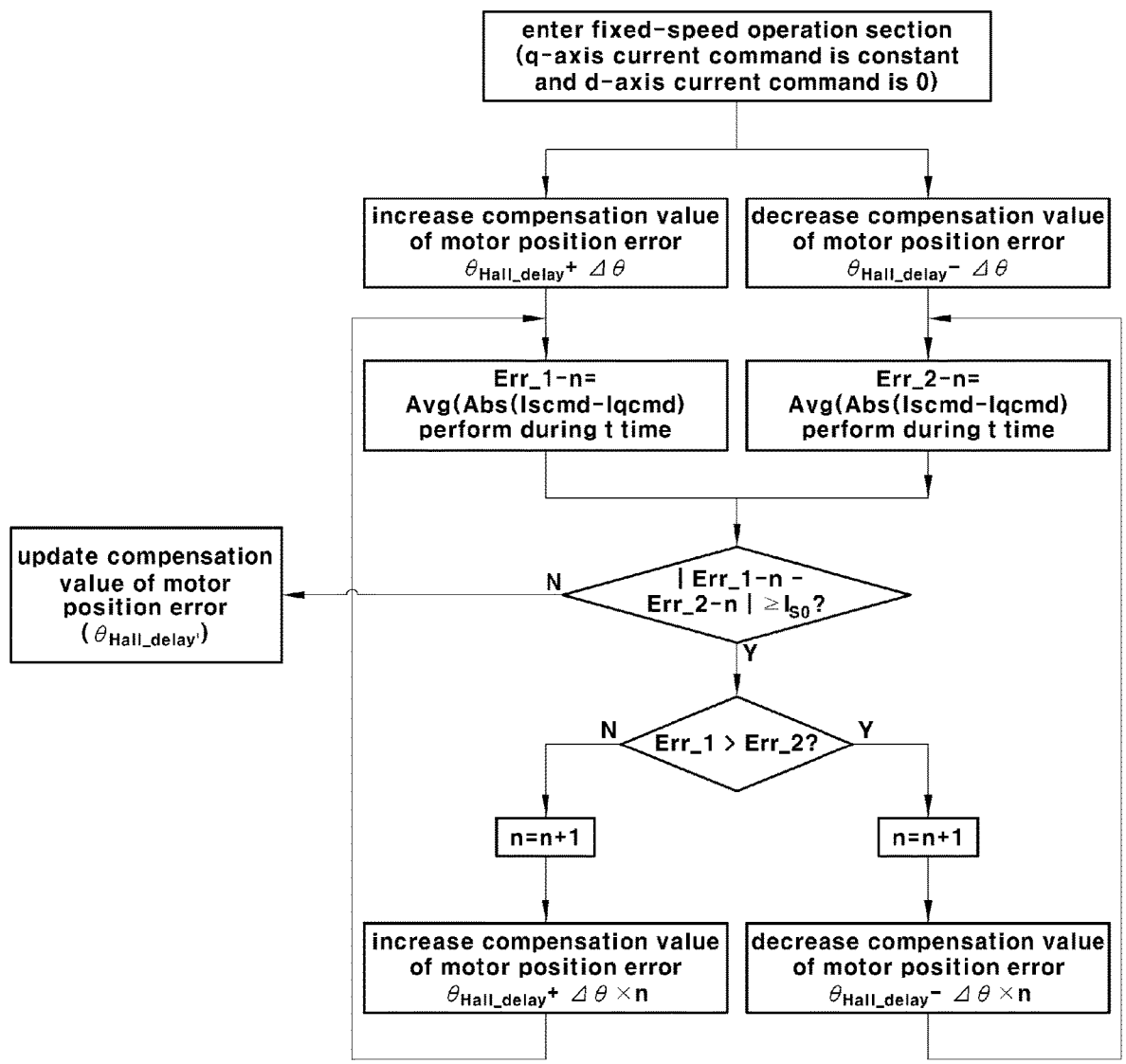

[FIG. 4]
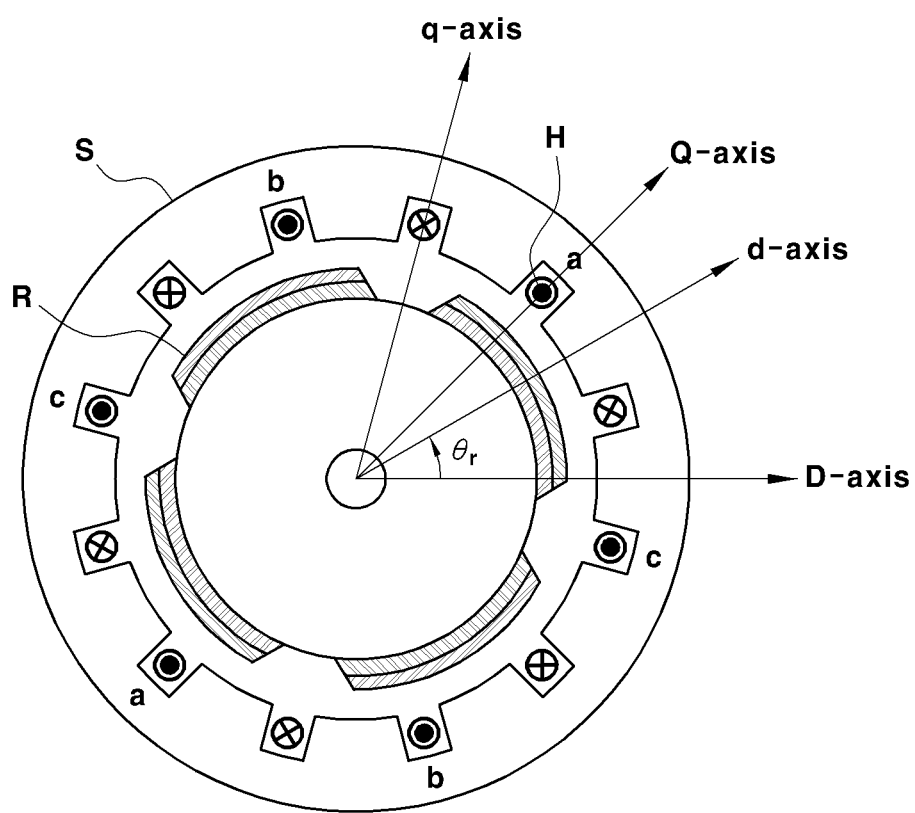

[FIG. 5A]
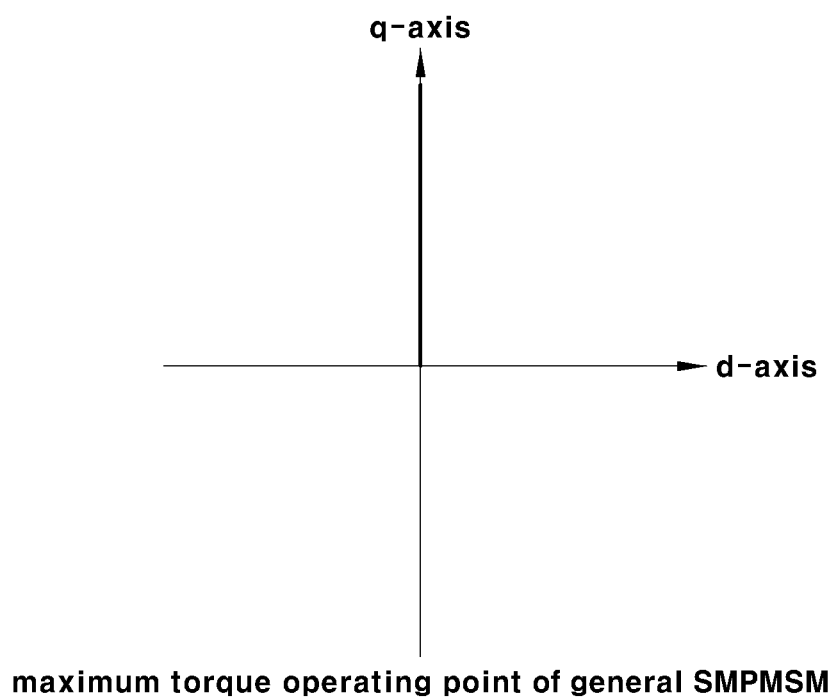
maximum torque operating point of general SMPMSM

[FIG. 5B]
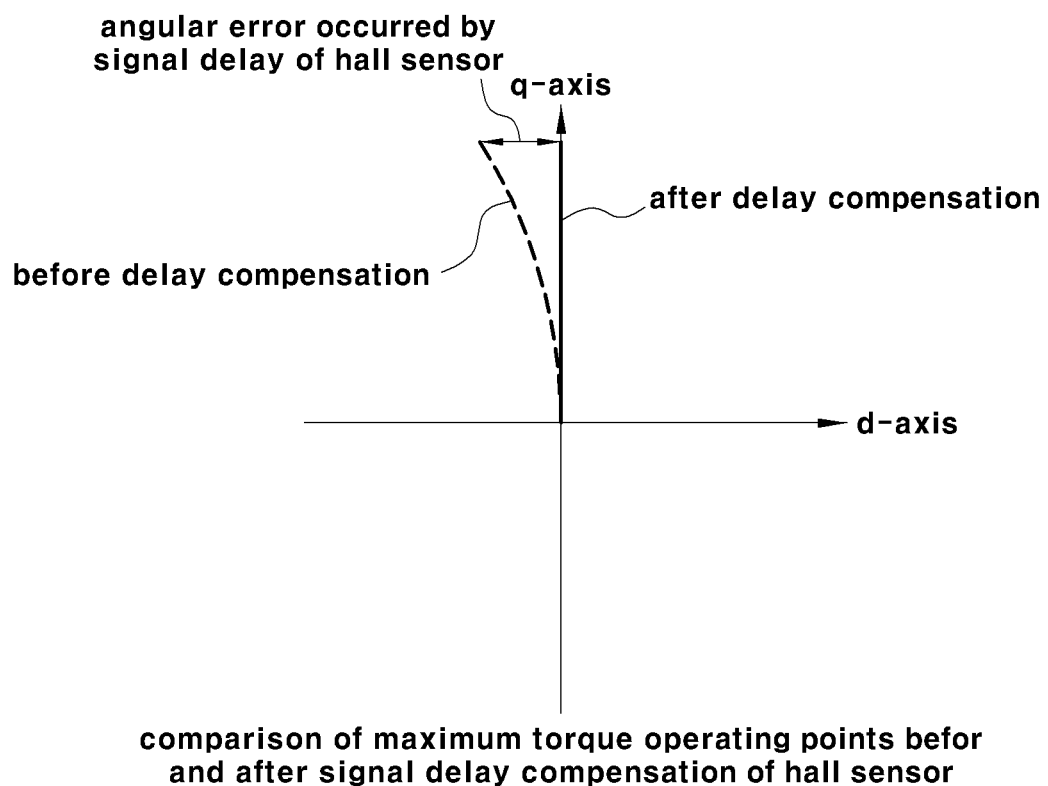
comparison of maximum torque operating points befor
and after signal delay compensation of hall sensor

METHOD OF CALCULATING MOTOR POSITION USING HALL SENSOR

CROSS-REFERENCE TO RELATED APPLICATIONS

This application claims priority to Korean Patent Application No. 10-2017-0160378, filed on Nov. 28, 2017, which application is hereby incorporated herein by reference.

TECHNICAL FIELD

The present disclosure relates to a method of calculating a motor position using a hall sensor.

BACKGROUND

In a fuel cell vehicle, a motor for air compressor is mounted for supplying air used for the power generation of the fuel cell, and a sensor for detecting a rotor position of the motor is used for precisely controlling the motor.

As the sensor for detecting the rotor position of the motor, a resolver sensor, a hall sensor, etc. can be used. In the resolver sensor, precise detection is possible compared to the hall sensor. But there is the disadvantage that it is expensive. The hall sensor is inexpensive compared to the resolver sensor, but there is the disadvantage that detection precision is low.

Meanwhile, since torque oscillation phenomenon occurs upon the high-speed rotation of the motor, the delay with respect to signal value measurement of the hall sensor is present in case of detecting the rotor position of the motor (hereinafter, referred to as 'a motor position') using the hall sensor. There occur the problems that calculation precision of the motor position is reduced due to the delay of the signal value measurement of the hall sensor and eventually, control precision of the motor speed is reduced.

The above information disclosed in this Background section is only for enhancement of understanding of the background of the disclosure and therefore it may contain information that does not form the prior art that is already known to a person of ordinary skill in the art.

Korean Patent No. 10-1655537 is related to subject matter disclosed in the specification.

SUMMARY

The present disclosure relates to a method of calculating a motor position using a hall sensor, and in particular embodiments, to a method of calculating a motor position using a hall sensor for more accurately calculating the motor position by compensating an error element occurring when calculating the motor position using the hall sensor.

Embodiments of the present disclosure can be used to help solve the above problems. For example, embodiments provide a method of calculating a motor position using a hall sensor, which in detecting the motor position using a signal value of the hall sensor, can more accurately compensate and calculate a motor position value miscalculated due to the signal measurement delay of the hall sensor, thus improving calculation precision of the motor position and thereby enhancing motor current control performance and motor speed control performance of a motor controller.

Accordingly, the present disclosure provides a method of calculating the motor position using the hall sensor that includes calculating a motor position ($\theta$Hall) if a signal change of a hall sensor installed to a motor occurs. A basic compensation value ($\theta$Hall_delay) is calculated for compensating a motor position error due to signal measurement delay of the hall sensor. It is determined whether a current command condition for the constant-speed operation of the motor is satisfied. The method includes calculating a first-up compensation value increasing the basic compensation value ($\theta$Hall_delay) by an additional compensation value ($\Delta\theta$), and a first-down compensation value decreasing the basic compensation value ($\theta$Hall_delay) by the additional compensation value ($\Delta\theta$) if the current command condition is satisfied. The method also includes calculating an average value (Err_1-1) of the deviation between d-q axes current commands generated during a setting time in case of correcting the motor position ($\theta$Hall) using the first-up compensation value, calculating an average value (Err_2-1) of the deviation between the d-q axes current commands generated during the setting time in case of correcting the motor position ($\theta$Hall) using the first-down compensation value, and correcting the motor position ($\theta$Hall) using the basic compensation value ($\theta$Hall_delay) if a difference between the Err_1-1 and the Err_2-1 is less than a reference average value (Iso).

Herein, the basic compensation value ($\theta$Hall_delay) is $\theta\text{Hall\_delay}=(\omega r/2\pi)\times T_{Hall\_delay}\times 360°$, the car is a motor angular speed, and the $T_{Hall\_delay}$ is a delay time with respect to signal measurement of the hall sensor. In addition, the current command condition for the constant-speed operation of the motor is that the d-axis current command is o and the q-axis current command is maintained as a constant value.

And, the method of calculating the motor position includes increasing a compensation value calculating a nth-up compensation value increasing the basic compensation value ($\theta$Hall_delay) by 'an additional compensation value ($\Delta\theta$) $\times$n' if the Err_2-1 is smaller than the Err_1-1 in the case that the difference between the Err_1-1 and the Err_2-1 is equal to or larger than the reference average value (Iso); calculating an average value calculating an average value (Err_1-n) of the deviation between the d-q axes current commands generated during the setting time in case of correcting the motor position ($\theta$Hall) using the nth-up compensation value; repeating the increasing of the compensation value and the calculating of the average value until the difference between the Err_1-n and the Err_2-1 becomes less than the reference average value (Iso); and correcting the motor position ($\theta$Hall) using a final error compensation value ($\theta$Hall_delay') after calculating the final error compensation value ($\theta$Hall_delay') using a n value when the difference between the Err_1-n and the Err_2-1 becomes less than the reference average value (Iso). The final error compensation value ($\theta$Hall_delay') is $\theta$Hall_delay'=the basic compensation value ($\theta$Hall_delay)+ the additional compensation value ($\Delta\theta$)$\times$(n-1), and the n indicates a cumulative count calculating the average value (Err_1-n) of the deviation between the d-q axes current commands.

In addition, the method of calculating the motor position includes increasing a compensation value calculating a nth-down compensation value decreasing the basic compensation value by 'an additional compensation value ($\Delta\theta$)$\times$(n-1)' if the Err_2-1 is larger than the Err_1-1 in the case that the difference between the Err_1-1 and the Err_2-1 is equal to or larger than the reference average value (Iso); calculating an average value calculating the average value (Err_2-n) of the deviation between the d-q axes current commands generated during the setting time in case of correcting the motor position ($\theta$Hall) using the nth-down compensation value; repeating the increasing of the compensation value and the calculating of the average value until the difference between the Err_1-1 and the Err_2-n becomes less than the reference average value (Iso); and correcting the motor position (θHall) using a final error compensation value (θHall_delay') after calculating the final error compensation value (θHall_delay') using a n value until the difference between the Err_1-1 and the Err_2-n becomes less than the reference average value (Iso). The final error compensation value (θHall_delay') is θHall_delay'=the basic compensation value (θHall_delay)−the additional compensation value (Δθ)×(n-1), and the n indicates a cumulative count calculating the average value (Err_2-n) of the deviation between the d-q axes current commands.

According to the present disclosure, it is possible to accurately correct and calculate the motor position rotating at a high speed using the hall sensor and thereby to improve calculation precision of the motor position, thus enhancing motor current control performance and motor speed control performance of the motor controller, and to also obtain the motor position measurement precision corresponding to performance of an expensive resolver using a relatively inexpensive hall sensor, thus achieving cost savings.

Other aspects and preferred embodiments of the disclosure are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the disclosure are discussed infra.

BRIEF DESCRIPTION OF THE DRAWINGS

The above and other features of the present disclosure will now be described in detail with reference to certain exemplary embodiments thereof illustrated the accompanying drawings which are given hereinbelow by way of illustration only, and thus are not limitative of the present disclosure, and wherein:

FIG. 1 is a configuration diagram of a system for performing a method of calculating a motor position using a hall sensor in accordance with the present disclosure.

FIGS. 2 and 3 are flowcharts for explaining the method of calculating the motor position using the hall sensor in accordance with the present disclosure.

FIG. 4 is a diagram illustrating, as one example, a cross-sectional structure of a Surface Mounted Permanent Magnet Synchronous Motor (SMPMSM).

FIG. 5(a) is a diagram illustrating a maximum torque operating point (an operating point where the maximum torque generates) of a general SMPMSM in the fixed-speed operation section, and FIG. 5(b) is a diagram illustrating comparison of the maximum torque operating points before and after compensating an error due to signal measurement delay of the hall sensor.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION OF ILLUSTRATIVE EMBODIMENTS

Hereinafter reference will now be made in detail to various embodiments of the present disclosure, examples of which are illustrated in the accompanying drawings and described below. While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

In the whole description, it will be understood that when a component is referred to as being "comprising" any component, it does not exclude other components, but can further comprises the other components unless otherwise specified.

Hereinafter, exemplary embodiments will be described so that those skilled in the art can easily practice the present disclosure.

In a motor including a rotor using a permanent magnet such as a Permanent Magnetic Synchronous Motor, the number of rotations of the motor can be detected using a signal value of a hall sensor, but torque oscillation phenomenon occurs upon high-speed rotation. Accordingly, if the motor detects a rotor position of the motor (hereinafter, referred to as 'a motor position') using the signal value of the hall sensor, the delay with respect to signal value measurement of the hall sensor is present, and there occur the problems that calculation precision of the motor position is reduced due to the signal value measurement delay of the hall sensor and eventually, control precision of the motor speed is reduced.

The present disclosure can, in detecting the motor position using the signal value of the hall sensor, more accurately compensate and calculate a motor position value miscalculated by the signal value measurement delay of the hall sensor, thus improving calculation precision of the motor position and thereby enhancing motor current control performance and motor speed control performance of a motor controller (or referred to as 'an inverter controller').

FIG. 1 is a configuration diagram of a system for performing a method of calculating a motor position using a hall sensor in accordance with the present disclosure.

As illustrated in FIG. 1, a system for performing the method of calculating the motor position using the hall sensor in accordance with the present disclosure can be configured to include a hall sensor mounted to a motor as a position detection sensor, a motor controller controlling a driving current of the motor and a rotation speed of the motor by receiving a signal of the hall sensor; and a micom in the motor controller connected with the hall sensor via a three-phase signal line to sense a signal change of the hall sensor.

The motor controller has a three-phase switching circuit for controlling a three-phase current output, and performs a PWM duty control of switches in the three-phase switching circuit at a frequency in a predetermined range to perform a current control for controlling a motor output.

In addition, the motor controller performs various operations (motor position and speed calculation, three-phase current sensing, current control, determination of next three-phase voltage output value, determination of next PWM duty, etc.) that are necessary for determining PWM duty per an update cycle of the PWM duty determined by a switching frequency of the three-phase switching circuit.

The motor controller includes a current controller for controlling driving current of the motor, and in order for the current controller to accurately control the driving current of the motor, accurate motor position information is needed per each PWM duty cycle.

The method of calculating the motor position using the hall sensor of the present disclosure configured based on the system will be described below with reference to FIGS. 2 and 3.

FIG. 2 is a flowchart schematically illustrating the procedure calculating a motor final position considering a motor position error upon a signal change of the hall sensor, and FIG. 3 is a flowchart schematically illustrating a compensation value update procedure for increasing precision of a compensation value of the motor position error.

As illustrated in FIG. 2, firstly, it is determined that the signal change of the hall sensor occurs.

The hall sensor is mounted to a predetermined position of the motor at a predetermined angular interval in order to detect the motor position, and as the rotor of the motor rotates, each hall sensor generates a digital signal of ON or OFF.

If the signal (ON or OFF) of the hall sensor changes, the micom generates an event triggered by the signal change of the hall sensor, and the time information when the signal of the hall sensor changes, that is, an internal clock counter value of a CPU for measuring a time ($T_{Hall}$) at a signal conversion point of the hall sensor is automatically recorded in a predetermined memory in the micom in accordance with the generated event. The CPU can be the configuration included in the motor controller.

Thus, as the internal clock counter value of the CPU for measuring the time ($T_{Hall}$) when the signal value of the hall sensor changes is automatically recorded in the predetermined memory of the micom, the time when the signal value of the hall sensor changes is accurately known unlike the convention. However, the micom recognizes the signal change of the hall sensor after the time ($T_{Hall}$) when the signal value of the hall sensor changes, and accordingly, the time ($T_{Hall}'$) when the micom recognizes the signal change of the hall sensor has the time difference ($T_{Hall}'-T_{Hall}=T_{Hall\_delay}$) from the time ($T_{Hall}$) when the signal value of the hall sensor changes.

That is, the time difference ($T_{Hall}'-T_{Hall}=T_{Hall\_delay}$) between the time ($T_{Hall}$) when the signal change of the hall sensor changes and the time ($T_{Hall}'$) when the signal change of the hall sensor is detected by the micom, that is, the delay time ($T_{Hall\_delay}$) with respect to the signal measurement of the hall sensor is present. The reason why the delay time ($T_{Hall\_delay}$) occurs is that the signal is not measured at the time when the signal change of the hall sensor occurs by periodically sensing the signal of the hall sensor depending upon a PWM duty cycle.

The motor position error ($\theta Hall\_delay$) due to the occurrence of the delay time ($T_{Hall\_delay}$) can be calculated as in Equation 1 below, and a compensation value with respect to the motor position error ($\theta Hall\_delay$), that is, a basic compensation value ($\theta Hall\_delay$) can be calculated as in Equation 1 below. That is, the basic compensation value ($\theta Hall\_delay$) has the same value as the motor position error ($\theta Hall\_delay$) due to the delay time ($T_{Hall\_delay}$).

$$\theta Hall\_delay = (\omega r/\pi) \times T_{Hall\_delay} \times 360° \qquad \text{Equation 1}$$

Herein, the $\omega r$ is an electrical angle rotation speed of the motor, that is, a motor angular speed.

The basic compensation value ($\theta Hall\_delay$) can be increased or decreased through the procedure in FIG. 3, and it will be later described with reference to FIG. 3.

As illustrated in FIG. 2, if the signal change of the hall sensor is detected, the motor angular speed ($\omega r$) and the motor position ($\theta Hall$) are calculated.

The motor angular speed ($\omega r$), as the rotation speed of the motor rotor, can be calculated based on the time information ($T_{Hall}$) when the signal of the hall sensor changes and the time information ($T_{Hall\_old}$) when the signal change of the hall sensor occurs, and the motor position ($\theta Hall$) can be calculated based on the time difference ($\Delta T$) between the time information ($T_{current}$) when operation for determining a PWM switching duty begins and the time information ($T_{Hall}$) when the signal of the hall sensor changes. The $T_{current}$ can be confirmed by reading the internal clock counter value of the CPU.

The motor angular speed ($\omega r$) (or, referred to as the motor speed) and the motor position ($\theta Hall$) can be calculated in accordance with the method of detecting the motor position and calculating the speed thereof using the hall sensor disclosed in Korean Patent No. 10-1655537, but the present disclosure is not limited thereto. That is, the motor angular speed ($\omega r$) and the motor position ($\theta Hall$) can be also calculated by the method different from the method disclosed in the Korean Patent.

The motor position ($\theta Hall$) is the value that an error (that is, a motor position error) due to the signal measurement delay of the hall sensor is not corrected, and the motor position where the error is corrected, that is, a motor final position ($\theta Hall\_Final$) (or, referred to as 'a motor actual position') can be calculated as in Equation 2 below.

$$\theta Hall\_Final = \theta Hall + \theta Hall\_delay \qquad \text{Equation 2}$$

Herein, the $\theta Hall\_delay$ is the basic compensation value for compensating the motor position error due to the signal measurement delay of the hall sensor.

Meanwhile, as known, a current command for controlling driving current of the motor is performed by a vector sum of a d-axis current command and a q-axis current command.

In the motor that the high-speed operation occurs like a motor for air compressor mounted in a fuel cell vehicle, only q-axis current contributes to a motor output torque in the fixed-speed operation section (that is, the constant-speed operation mode), such that if the motor position error is present, the deviation between total current command value (Is) (or, referred to as 'motor current command (Is)') that is the vector sum of the d-axis current command and the q-axis current command occurs.

Accordingly, in order to reduce the deviation, a final error compensation value ($\theta Hall\_delay'$) is calculated as the motor error compensation value that increases or decreases the basic compensation value ($\theta Hall\_delay$) using an additional compensation value ($\Delta \theta$), and the final error compensation value ($\theta Hall\_delay'$) is determined as the motor error compensation value that is updated in order to correct the motor position error more accurately.

The final error compensation value ($\theta Hall\_delay'$) can be determined by 'the basic compensation value ($\theta Hall\_delay$)

', or 'the basic compensation value (θHall_delay)±(n-1)×the additional compensation value (Δθ)' depending upon the deviation size between the motor current commands (Is).

As illustrated in FIG. 3, firstly, it is determined if the motor enters the fixed-speed operation section that is operated at the fixed constant speed without speed change. That is, it is determined if a motor operation condition, which the d-axis current command is o and the q-axis current command is maintained at a constant value without fluctuation depending upon the motor speed among the current commands for the motor current control, is satisfied. In this time, the condition that the motor speed is a constant speed without fluctuation and the condition that the q-axis current command is a constant value without fluctuation mean only that the motor speed and the q-axis current command are fixed as the value determined depending upon the operation mode, and are not fixed to the setting value.

If the motor operation condition is satisfied, a first-up compensation value increasing the basic compensation value (θHall_delay) with respect to the motor position error by the additional compensation value (Δθ) and a first-down compensation value decreasing the basic compensation value (θHall_delay) by the additional compensation value (Δθ) are calculated as in Equation 3.

the first-up compensation value=θHall_delay+Δθ the first-down compensation value=θHall_delay−Δθ    Equation 3

The basic compensation value (θHall_delay) can be calculated as in Equation 1 described above, and the additional compensation value (Δθ) can be set as the value extracted through preliminary experiment, etc.

In case of correcting the motor position (θHall) using the first-up compensation value, the average value (Err_1-1) of the deviation between the motor current commands (Iscmd) outputted for the motor current control in the current controller of the motor controller during a setting time (t), that is, the d-q axes current commands (Iscmd) with respect to the driving current of the motor can be calculated as in Equation 4 below. And, in case of correcting the motor position (θHall) using the first-down compensation value, the average value (Err_2-1) of the deviation between a plurality of d-q axes current commands (Iscmd) outputted from the current controller during the setting time (t) can be calculated as in Equation 4 below.

Err_1-1=Avg {Abs(Iscmd−Iqcmd)}

Err_2-1=Avg {Abs(Iscmd−Iqcmd)}    Equation 4

According to Equation 4, the Err_1-1 and the Err_2-1 are the average values of the deviation between the values obtained by subtracting the q-axis current command (Iqcmd) from the d-q axes current command (Iscmd), that is, the d-axis current commands (Idcmd).

As illustrated in Equation 4, the method of calculating the Err_1-1 and the Err_2-1 is the same, but is calculated as different values depending upon the d-q axes current commands used for the calculation of the Err_1-1 and the d-q axes current commands used for the calculation of the Err_2-1.

If the difference between the Err_1-1 and the Err_2-1 is less than the reference average value (Iso), the basic compensation value (θHall_delay) is determined as the final error compensation value (θHall_delay') to correct the motor position (θHall). Herein, the reference average value (Iso) can be set as the value extracted through preliminary experiment, etc.

And, if the difference between the Err_1-1 and the Err_2-1 is equal to or larger than the reference average value (Iso), the basic compensation value (θHall_delay) is changed using the additional compensation value (Δθ) so that the difference between the Err_1-1 and the Err_2-1 becomes smaller.

Specifically, if the Err_1-1 is smaller than the Err_2-1 by comparing the sizes between the Err_1-1 and the Err_2-1, a second-up compensation value [the basic compensation value (θHall_delay)+the additional compensation value (Δθ)×2], which increases the first-up compensation value by the additional compensation value (Δθ) by adding the additional compensation value (Δθ) to the first-up compensation value [the basic compensation value (θHall_delay)+the additional compensation value (Δθ)], is calculated, and the average value (Err_1-2) of the deviation between the motor current commands (Iscmd) changed by correcting the motor position using the second-up compensation value, that is, the d-q axes current commands (Iscmd) is again calculated.

If the difference between the Err_1-2 and the Err_2-1 is equal to or larger than the reference average value (Iso), a third-up compensation value [the basic compensation value (θHall_delay)+the additional compensation value (Δθ)×3] is calculated, and the average value (Err_1-3) of the deviation between the motor current commands (Iscmd) changed by correcting the motor position using the third-up compensation value, that is, the d-q axes current commands (Iscmd) is again calculated. In this time, the Err_1-2 and the Err_1-3 can be calculated in the same way as the Err_1-1 of Equation 4 above.

Thus, the motor error compensation value is increased by repeating the procedure adding the additional compensation value (Δθ) to the basic compensation value (θHall_delay), and it is determined if the difference between the average value (Err_1-n) of the deviation between the d-q axes current commands (Iscmd) changed by correcting the motor position using the motor error compensation value [that is, the basic compensation value (θHall_delay)+the additional compensation value (Δθ)×n] obtained by summing 'the additional compensation value (Δθ)×n' and the basic compensation value (θHall_delay) and the Err_2-1 becomes less than the reference average value (Iso).

If the difference between the Err i-n and the Err_2-1 becomes less than the reference average value (Iso), the final error compensation value (θHall_delay') is calculated based on the n value at that time, and the final error compensation value (θHall_delay') can be calculated as in Equation 5 below.

the final error compensation value (θHall_delay')= the basic compensation value (θHall_delay)+the additional compensation value (Δθ)×(n-1)    Equation 5

The n indicates a cumulative count calculating the average value (Err_1-n) of the deviation between the d-q axes current commands (Iscmd), and an initial value is '1.'

In addition, if the Err_1-1 is larger than the Err_2-1 by comparing the sizes between the Err _1-1 and the Err_2-1, a second-down compensation value [the basic compensation value (θHall_delay)−the additional compensation value (Δθ)×2], which decreases the first-down compensation value by the additional compensation value (Δθ) by subtracting the additional compensation value (Δθ) from the first-down compensation value [the basic compensation value (θHall_delay)−the additional compensation value (Δθ)], is calculated, and an average value (Err_2-2) of the deviation between the motor current commands (Iscmd) changed by correcting the motor position using the second-down compensation value, that is, the d-q axes current commands (Iscmd) is again calculated.

If the difference between the Err_1-1 and the Err_2-2 is equal to or larger than the reference average value (Iso), a third-down compensation value [the basic compensation value (θHall_delay)−the additional compensation value (Δθ)×3] is calculated, and an average value (Err_2-3) of the deviation between the motor current commands (Iscmd) changed by correcting the motor position using the third-down compensation value, that is, the d-q axes current commands (Iscmd) is again calculated. In this time, the Err_2-2 and the Err_2-3 can be calculated in the same way as the Err_2-1 of Equation 4 above.

Thus, the basic compensation value (θHall_delay) is decreased by repeating the procedure subtracting the additional compensation value (Δθ) from the basic compensation value (θHall_delay), and it is determined if the difference between the average value (Err_2-n) of the deviation between the d-q axes current commands (Iscmd) changed by correcting the motor position using the compensation value [that is, the basic compensation value (θHall_delay)−the additional compensation value (Δθ)×n] obtained by subtracting 'the additional compensation value (Δθ)×n' from the basic compensation value (θHall_delay) and the Err_1-1 becomes less than the reference average value (Iso).

The average values (Err_1-n, Err_2-n) of the deviation between the d-q axes current commands (Iscmd) are calculated as the average values of the deviation between the d-q axes current commands outputted during the setting time (t) from the current controller after correcting the motor position.

If the difference between the Err_1-1 and the Err_2-n becomes less than the reference average value (Iso), the final error compensation value (θHall_delay') is calculated based on the n value at that time, and the final error compensation value (θHall_delay') can be calculated as in Equation 6 below.

Equation 6: the final error compensation value (θHall_delay')=the basic compensation value (θHall_delay)−the additional compensation value (Δθ)×(n−1)

The n indicates a cumulative count calculating the average value (Err_2-n) of the deviation between the d-q axes current commands (Iscmd), and an initial value is 'i.'

The motor final position (θHall_Final) can be calculated by compensating the error of the motor position (θHall) using the final error compensation value (θHall_delay') determined as in the above, and the motor final position (θHall_Final) can be calculated as in Equation 7 below by determining the final error compensation value (θHall_delay') as the value that updates the basic compensation value (θHall_delay) of Equation 2 described above using the additional compensation value (Δθ).

$$\theta Hall\_Final = \theta Hall + \theta Hall\_delay' \qquad \text{Equation 7}$$

According to the method of calculating the motor position of the present disclosure, it is possible to precisely compensate the error (the error due to the signal measurement delay of the hall sensor) occurring when calculating the motor position using the hall sensor and accordingly, to precisely calculate the motor position using the signal value of the hall sensor even upon the high-speed operation at 100,000 rpm or more of the motor that generates a high speed-operation difficult to precisely calculate the motor position using the conventional hall sensor, for example, a Surface Mounted Permanent Magnetic Synchronous Motor (SMPMSM) used as the motor for air compressor of the fuel cell vehicle.

In addition, the final error compensation value (θHall_delay') determined as described above upon the production of the vehicle or after replacement of the motor is calculated first once, and can be stored in a Non-volatile memory (NVRAM) of the motor controller to be used as the motor error compensation value every time the signal change of the hall sensor occurs. Or, if the motor constant-speed operation section occurs depending upon the control pattern of the device (e.g., the air compressor of the fuel cell) using the power of the motor every time the vehicle starts, the final error compensation value (θHall_delay') can be calculated and updated in order to correct the error (the motor position error) due to the signal measurement delay of the hall sensor in the motor constant-speed operation section every time the vehicle starts.

Meanwhile, FIG. 4 is a diagram illustrating, as one example, the cross-sectional structure of the Surface Mounted Permanent Magnet Synchronous Motor (SMPMSM), FIG. 5(a) is a diagram illustrating the maximum torque operating point (the operating point where the maximum torque occurs) of general SMPMSM in the fixed-speed operation section, and FIG. 5(b) is a diagram illustrating by comparison the maximum torque operating points before and after compensating the motor position error due to the signal measurement delay of the hall sensor.

In the motor to which the method of calculating the motor position of the present disclosure is applied, for example, in the SMPMSM as illustrated in FIG. 4, a plurality of hall sensors (H) are located on a stator (S) at regular intervals, and the signal change of the hall sensor (H) occurs depending upon the mounted position of the hall sensor (H) and the rotation position of the motor rotor (R).

In the SMPMSM, if the motor position error does not occur due to the signal measurement delay of the hall sensor in the fixed-speed operation section, as illustrated in FIG. 5(a), it is normal that only the q-axis current command occurs at the maximum torque operating point. However, if the signal measurement delay of the hall sensor occurs even in the state that has entered the fixed-speed operation section, the d-axis current command that is not 'o' occurs; as illustrated in FIG. 5(b), an angular error occurs due to the signal measurement delay of the hall sensor; and thereby the motor position error occurs. As described above, in accordance with the present disclosure, by determining the final error compensation value (θHall_delay') and compensating the error of the motor position (θall) using the final error compensation value (θHall_delay'), the motor final position (θHall_Final) where the angular error due to the signal measurement delay of the hall sensor is corrected can be calculated.

Having described the embodiments of the present disclosure in detail, the scope of the present disclosure is not limited to the above-described embodiments, and various modifications and improvements of those skilled in the art using the basic concept of the present disclosure as defined in the following claims are also included in the scope of the present disclosure.

What is claimed is:

1. A method of calculating a motor position using a hall sensor, the method comprising:
   determining a motor position in response to a signal change of a hall sensor installed to a motor;
   calculating a basic compensation value for compensating a motor position error due to signal measurement delay of the hall sensor;

determining whether a current command condition for a constant-speed operation of the motor is satisfied;

calculating a first-up compensation value that increases the basic compensation value by an additional compensation value, and a first-down compensation value that decreases the basic compensation value by the additional compensation value when the current command condition is satisfied;

calculating an average value Err_1-1 of a deviation between d-q axes current commands generated during a setting time when correcting the motor position using the first-up compensation value;

calculating an average value Err_2-1 of the deviation between the d-q axes current commands generated during the setting time when correcting the motor position using the first-down compensation value; and correcting the motor position using the basic compensation value when a difference between the average value Err_1-1 and the average value Err_2-1 is less than a reference average value.

2. The method of claim 1, wherein the basic compensation value is $$\theta Hall\_delay=(\omega r/2\pi)\times THall\_delay\times 360°,$$

where ωr is a motor angular speed, and THall_delay is a delay time with respect to signal measurement of the hall sensor.

3. The method of claim 1, comprising:

increasing a compensation value calculating an nth-up compensation value increasing the basic compensation value by an additional compensation value×n if the average value Err_2-1 is smaller than the average value Err_1-1 when the difference between the average value Err_1-1 and the average value Err_2-1 is equal to or larger than the reference average value;

calculating an average value calculating an average value Err_1-n of the deviation between the d-q axes current commands generated during the setting time in case of correcting the motor position using the nth-up compensation value;

repeating the increasing of the compensation value and the calculating of the average value until the difference between the average value Err_1-n and the average value Err_2-1 becomes less than the reference average value; and correcting the motor position using a final error compensation value after calculating the final error compensation value using an n value when the difference between the average value Err_1-n and the average value Err_2-1 becomes less than the reference average value, wherein n is a cumulative count calculating the average value Err_1-n of the deviation between the d-q axes current commands.

4. The method of claim 3, wherein the final error compensation value is θHall_delay'=the basic compensation value+the additional compensation value×(n−1).

5. The method of claim 1, comprising:

increasing a compensation value calculating a nth-down compensation value decreasing the basic compensation value by an additional compensation value×(n−1) if the average value Err_2-1 is larger than the average value Err_1-1 when the difference between the average value Err_1-1 and the average value Err_2-1 is equal to or larger than the reference average value;

calculating an average value calculating an average value Err_2-n of the deviation between the d-q axes current commands generated during the setting time in case of correcting the motor position using the nth-down compensation value;

repeating the increasing of the compensation value and the calculating of the average value until the difference between the average value Err_1-1 and the average value Err_2-n becomes less than the reference average value; and correcting the motor position using a final error compensation value after calculating the final error compensation value using a n value when the difference between the average value Err_1-1 and the average value Err_2-n becomes less than the reference average value, wherein the n is a cumulative count calculating the average value Err_2-n of the deviation between the d-q axes current commands.

6. The method of claim 5, wherein the final error compensation value is θHall delay'=the basic compensation value−the additional compensation value×(n−1).

7. The method of claim 1, wherein the current command condition for the constant-speed operation of the motor is that a d-axis current command is o and a q-axis current command is maintained as a constant value.

8. A method of operating a vehicle, the method comprising:

measuring a signal change of a hall sensor installed to a motor of the vehicle;

calculating a motor position in response to the signal change of the hall sensor installed to a motor;

calculating a basic compensation value for compensating a motor position error due to signal measurement delay of the hall sensor;

determining whether a current command condition for a constant-speed operation of the motor is satisfied;

calculating a first-up compensation value that increases the basic compensation value by an additional compensation value, and a first-down compensation value that decreases the basic compensation value by the additional compensation value when the current command condition is satisfied;

calculating an average value Err_1-1 of a deviation between d-q axes current commands generated during a setting time when correcting the motor position using the first-up compensation value;

calculating an average value Err_2-1 of the deviation between the d-q axes current commands generated during the setting time when correcting the motor position using the first-down compensation value;

correcting the motor position using the basic compensation value when a difference between the average value Err_1-1 and the average value Err_2-1 is less than a reference average value;

controlling the motor based of the corrected motor position.

9. The method of claim 8, wherein the basic compensation value is $$\theta Hall\_delay=(\omega r/2\pi)\times THall\_delay\times 360°,$$

where ωr is a motor angular speed, and THall_delay is a delay time with respect to signal measurement of the hall sensor.

10. The method of claim 8, comprising:

increasing a compensation value calculating an nth-up compensation value increasing the basic compensation value by an additional compensation value×n if the average value Err_2-1 is smaller than the average value Err_1-1 when the difference between the average value Err_1-1 and the average value Err_2-1 is equal to or larger than the reference average value;

calculating an average value calculating an average value Err_1-n of the deviation between the d-q axes current commands generated during the setting time in case of correcting the motor position using the nth-up compensation value;

repeating the increasing of the compensation value and the calculating of the average value until the difference between the average value Err_1-n and the average value Err_2-1 becomes less than the reference average value; and correcting the motor position using a final error compensation value after calculating the final error compensation value using an n value when the difference between the average value Err_1-n and the average value Err_2-1 becomes less than the reference average value, wherein n is a cumulative count calculating the average value Err_1-n of the deviation between the d-q axes current commands.

11. The method of claim 10, wherein the final error compensation value is θHall_delay'=the basic compensation value+the additional compensation value×(n−1).

12. The method of claim 8, comprising:

increasing a compensation value calculating a nth-down compensation value decreasing the basic compensation value by an additional compensation value×(n−1) if the average value Err_2-1 is larger than the average value Err_1-1 when the difference between the average value Err_1-1 and the average value Err_2-1 is equal to or larger than the reference average value;

calculating an average value calculating an average value Err_2-n of the deviation between the d-q axes current commands generated during the setting time in case of correcting the motor position using the nth-down compensation value;

repeating the increasing of the compensation value and the calculating of the average value until the difference between the average value Err_1-1 and the average value Err_2-n becomes less than the reference average value; and correcting the motor position using a final error compensation value after calculating the final error compensation value using a n value when the difference between the average value Err_1-1 and the average value Err_2-n becomes less than the reference average value, wherein the n is a cumulative count calculating the average value Err_2-n of the deviation between the d-q axes current commands.

13. The method of claim 12, wherein the final error compensation value is θHall_delay'=the basic compensation value−the additional compensation value×(n−1).

14. The method of claim 8, wherein the current command condition for the constant-speed operation of the motor is that a d-axis current command is o and a q-axis current command is maintained as a constant value.

15. A vehicle comprising:
a motor;
a hall sensor installed adjacent the motor; and
a motor controller coupled to the motor and the hall sensor, the motor controller configured to:
   determine a motor position in response to a signal change of the hall sensor;
   calculate a basic compensation value for compensating a motor position error due to signal measurement delay of the hall sensor;
   determine whether a current command condition for a constant-speed operation of the motor is satisfied;
   calculate a first-up compensation value that increases the basic compensation value by an additional compensation value, and a first-down compensation value that decreases the basic compensation value by the additional compensation value when the current command condition is satisfied;
   calculate an average value Err_1-1 of a deviation between d-q axes current commands generated during a setting time when correcting the motor position using the first-up compensation value;
   calculate an average value Err_2-1 of the deviation between the d-q axes current commands generated during the setting time when correcting the motor position using the first-down compensation value;
   correct the motor position using the basic compensation value when a difference between the average value Err_1-1 and the average value Err_2-1 is less than a reference average value;
   control the motor based on the corrected motor position.

16. The vehicle of claim 15, further comprising a fuel cell and an air compressor being mounted in a position for supplying air to the fuel cell, the motor coupled to the air compressor.

17. The vehicle of claim 15, wherein the motor controller includes a current controller configured to control a driving current of the motor, wherein the current controller is configured to utilize the corrected motor position to control the driving current of the motor for each of a plurality of PWM duty cycles.

18. The vehicle of claim 15, wherein the basic compensation value is $$\theta\text{Hall\_delay}=(\omega r/2\pi)\times T\text{Hall\_delay}\times 360°,$$

where ωr is a motor angular speed, and THall_delay is a delay time with respect to signal measurement of the hall sensor.

19. The vehicle of claim 15, wherein the motor controller is configured to:

increase a compensation value calculating an nth-up compensation value increasing the basic compensation value by an additional compensation value×n if the average value Err_2-1 is smaller than the average value Err_1-1 when the difference between the average value Err_1-1 and the average value Err_2-1 is equal to or larger than the reference average value;

calculate an average value calculating an average value Err_1-n of the deviation between the d-q axes current commands generated during the setting time in case of correcting the motor position using the nth-up compensation value;

repeat the increasing of the compensation value and the calculating of the average value until the difference between the average value Err_1-n and the average value Err_2-1 becomes less than the reference average value; and correct the motor position using a final error compensation value after calculating the final error compensation value using an n value when the difference between the average value Err_1-n and the average value Err_2-1 becomes less than the reference average value, wherein n is a cumulative count calculating the average value Err_1-n of the deviation between the d-q axes current commands.

20. The vehicle of claim 15, wherein the motor controller is configured to:
- increase a compensation value calculating a nth-down compensation value decreasing the basic compensation value by an additional compensation value×(n−1) if the average value Err_2−1 is larger than the average value Err_1−1 when the difference between the average value Err_1−1 and the average value Err_2−1 is equal to or larger than the reference average value;
- calculate an average value calculating an average value Err_2−n of the deviation between the d-q axes current commands generated during the setting time in case of correcting the motor position using the nth-down compensation value;
- repeat the increasing of the compensation value and the calculating of the average value until the difference between the average value Err_1−1 and the average value Err_2−n becomes less than the reference average value; and
- correct the motor position using a final error compensation value after calculating the final error compensation value using a n value when the difference between the average value Err_1−1 and the average value Err_2−n becomes less than the reference average value,
- wherein the n is a cumulative count calculating the average value Err_2−n of the deviation between the d-q axes current commands.

* * * * *